(12) United States Patent
Guo et al.

(10) Patent No.: US 10,770,320 B2
(45) Date of Patent: Sep. 8, 2020

(54) UNIVERSAL CHIP BATCH-BONDING APPARATUS AND METHOD

(71) Applicant: SHANGHAI MICRO ELECTRONICS EQUIPMENT (GROUP) CO., LTD., Shanghai (CN)

(72) Inventors: Song Guo, Shanghai (CN); Yuebin Zhu, Shanghai (CN); Feibiao Chen, Shanghai (CN); Hai Xia, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 0 days.

(21) Appl. No.: 16/338,673

(22) PCT Filed: Sep. 26, 2017

(86) PCT No.: PCT/CN2017/103332
§ 371 (c)(1),
(2) Date: Apr. 1, 2019

(87) PCT Pub. No.: WO2018/059375
PCT Pub. Date: Apr. 5, 2018

(65) Prior Publication Data
US 2020/0013647 A1 Jan. 9, 2020

(30) Foreign Application Priority Data
Sep. 30, 2016 (CN) .......................... 2016 1 0877683

(51) Int. Cl.
*H01L 21/67* (2006.01)
*H01L 23/00* (2006.01)

(52) U.S. Cl.
CPC ........ *H01L 21/67144* (2013.01); *H01L 24/75* (2013.01); *H01L 24/97* (2013.01)

(58) Field of Classification Search
None
See application file for complete search history.

(56) References Cited

U.S. PATENT DOCUMENTS

| 2018/0033658 A1* | 2/2018 | Maijala | H05K 13/021 |
| 2018/0035582 A1* | 2/2018 | Murai | H05K 1/0269 |

FOREIGN PATENT DOCUMENTS

| CN | 201522998 U | 7/2010 |
| CN | 103367208 A | 10/2013 |

(Continued)

OTHER PUBLICATIONS

Machine Translation of CN 103367208 (Year: 2015).*
Machine Translation of CN 104183527 (Year: 2015).*

*Primary Examiner* — J. E. Schoenholtz
(74) *Attorney, Agent, or Firm* — Muncy, Geissler, Olds & Lowe, P.C.

(57) ABSTRACT

A universal chip batch-bonding apparatus and method. The apparatus comprises a material pick-and-place area and a transfer work area. The material pick-and-place area comprises a blue tape pick-and-place area (110) for providing a chip (113) and a substrate pick-and-place area (120) for placing a substrate (123), the blue tape pick-and-place area (110) and the substrate pick-and-place area (120) being separately arranged at two ends of the transfer work area. The transfer work area sequentially comprises a chip pickup and separation area (210), a chip alignment and fine-tuning area (220), and a chip batch-bonding area (230) in a direction running from the blue tape pick-and-place area (110) to the substrate pick-and-place area (120). A chip carrier transfer apparatus (300) is provided in the transfer work area, and the chip carrier transfer apparatus (300) passes through the transfer work area and is used to move and supply materials among the chip pickup and separation area (210), the chip alignment and fine-tuning area (220), and the chip batch- (Continued)

bonding area (230). By means of a compatible design, the apparatus is suitable for both die-up and die-down attachment modes, expanding the application scope of the apparatus. In addition, the modular design can be configured according to requirements, increasing market potential.

12 Claims, 6 Drawing Sheets

(56) References Cited

FOREIGN PATENT DOCUMENTS

| | | |
|---|---|---|
| CN | 107134418 A | 9/2017 |
| CN | 107134422 A | 9/2017 |
| JP | 2000-164640 | 6/2000 |
| JP | 2009200203 A | 9/2009 |
| JP | 2015130414 A | 7/2015 |

\* cited by examiner

UNIVERSAL CHIP BATCH-BONDING APPARATUS AND METHOD

TECHNICAL FIELD

The present application relates to the field of chip bonding, and in particular, to a universal chip batch-bonding apparatus and method.

BACKGROUND

A flip-chip bonding technique is an interconnection process for integrating chips onto a substrate. As shown in FIG. 1, carried by a carrying board 5, a plurality of chips 2 on a carrier 1 are bonded to a substrate 4 in batch. The plurality of chips 2 are accurately placed on the carrying board 5 and sucked. During bonding, the chips 2 are securely positioned on the carrying board 5, and the distance L between the chips 2 is accurately maintained. Thus, serial bonding of a single chip 2 is replaced with parallel bonding of a plurality of chips 2, effectively enhancing productivity of the equipment. Moreover, since electronic products develop towards the trend of being light, thin, and miniaturized, the application of the chip bonding technology increases day by day. By combining the chip bonding technique with the wafer-level packaging technique, a package type with a small size and a high performance is able to be produced. If the chip bonding technique and a through-silicon via (TSV) technique are combined, a chip structure with a more competitive cost and performance is able to be produced. At present, there are three fan-out bonding techniques in the field, among which the fan-out bonding technique based on chip First is a widely-applied mainstream process. As shown in FIG. 2a and FIG. 2b, the fan-out bonding technique mainly has two chip mounting manners: the die-up manner (marks on the chips facing upwards) and the die-down manner (marks on the chips facing downwards). The marks 3 on the chips 2 does not contact the substrate 4 in the die-up mounting manner, while the marks 3 on the chips 2 contact the substrate 4 in the die-down mounting manner. The foregoing two mounting manners need different bonding apparatuses for chip bonding, i.e. no universal bonding apparatus is available, thus increasing the production costs.

On the other hand, the bonding technology enables chip stacking and integration to the maximum extent within a limited area without reducing the line width, and can reduce a wafer package size and line conduction length for a system on a chip (SoC), thereby improving wafer transmission efficiency. Compared to the wafer-to-wafer (W2W) technology, the chip-to-wafer (C2W) technology has a higher yield and a lower production cost. Therefore, it is the industry goal to ensure high bonding precision and also maintain high productivity of the C2W technology.

SUMMARY OF THE INVENTION

The present application provides a universal chip batch-bonding apparatus and method to solve the foregoing technical problem.

To solve the foregoing technical problem, the present application provides a universal chip batch-bonding apparatus, including a material pick-and-place area and a transfer work area, wherein the material pick-and-place area includes a blue tape pick-and-place section for providing chips and a substrate pick-and-place section for storing a substrate, the blue tape pick-and-place section and the substrate pick-and-place section being disposed at opposing ends of the transfer work area, respectively;

the transfer work area sequentially includes a chip pickup and separation section, a chip alignment and fine-tuning section, and a chip batch-bonding section along a direction from the blue tape pick-and-place section to the substrate pick-and-place section; and a chip carrying board conveyor is disposed in the transfer work area and arranged across the transfer work area, the chip carrying board conveyor moving between the chip pickup and separation section, the chip alignment and fine-tuning section, and the chip batch-bonding section to deliver materials.

Preferably, the chip carrying board conveyor includes a first moving platform, a pressurizing apparatus mounted on the first moving platform, and a carrying board mounted on the pressurizing apparatus.

Preferably, a separation platform, a flip hand, and a pick-and-place apparatus are provided in the chip pickup and separation section; wherein a fine tuning apparatus is provided in the chip alignment and fine-tuning section; and a carrying platform is provided in the chip batch-bonding section.

Preferably, the pick-and-place apparatus includes a support, a shifting unit mounted on the support and movable in a horizontal direction, a lifting unit mounted on the shifting unit and movable in a vertical direction, and a pick-and-place hand fixedly mounted on the lifting unit.

Preferably, a first alignment system is mounted on the lifting unit.

Preferably, the fine tuning apparatus includes a second moving platform as well as a fine tuning robotic arm and a second alignment system mounted on the second moving platform.

Preferably, a third alignment system is mounted on the carrying platform.

Preferably, a plurality of the lifting units are mounted on the shifting unit, and each lifting unit has one pick-and-place hand mounted therebeneath.

Preferably, a chip holder and a first robotic arm are provided in the blue tape pick-and-place section, and the first robotic arm picks up the chips on the chip holder and delivers the chips to the separation platform.

Preferably, a substrate store and a second robotic arm are provided in the substrate pick-and-place section; and the second robotic arm picks up the bonding-completed substrate on the carrying platform, and transfers the substrate to the substrate store.

Preferably, an ejecting mechanism is provided under the separation platform, for pushing up the chip placed on the separation platform.

The present application also provides a universal chip batch-bonding method, used with the foregoing universal chip batch-bonding apparatus, and including the following steps:

S1: transferring chips from a blue tape pick-and-place section to a chip pickup and separation section;

S2: picking up a plurality of the chips from the chip pickup and separation section, and simultaneously delivering the plurality of the chips to a chip alignment and fine-tuning section by a chip carrying board conveyor, for adjustment of position accuracy; and S3: after the adjustment is completed, delivering the plurality of the chips to a chip batch-bonding section by using the chip carrying board conveyor, to implement batch bonding.

Preferably, in step S2, if marks of the chips are required to face downwards during bonding, chips are picked up and flipped by a flip hand in the chip pickup and separation section and then are transferred to the chip carrying board conveyor; and if marks of the chips are required to face upwards during bonding, chips are picked up by a pick-and-place apparatus in the chip pickup and separation section and then are transferred the chip carrying board conveyor after subjected to accuracy adjustment in the chip alignment and fine-tuning section.

Compared with the prior art, the universal chip batch-bonding apparatus and method provided in the present application includes a material pick-and-place area and a transfer work area, where the material pick-and-place area includes a blue tape pick-and-place section for providing chips and a substrate pick-and-place section for storing a substrate, the blue tape pick-and-place section and the substrate pick-and-place section being disposed at opposing ends of the transfer work area, respectively; the transfer work area sequentially includes a chip pickup and separation section, a chip alignment and fine-tuning section, and a chip batch-bonding section along a direction from the blue tape pick-and-place section to the substrate pick-and-place section; a chip carrying board conveyor is disposed in the transfer work area and arranged across the transfer work area, the chip carrying board conveyor moving between the chip pickup and separation section, the chip alignment and fine-tuning section, and the chip batch-bonding section to deliver materials. By means of a compatible design, the apparatus of the present application is universal for two chip mounting manners, thereby expanding the application scope of the apparatus. In addition, the modular design is able to be configured as required, increasing the market potential of the apparatus.

BRIEF DESCRIPTION OF THE DRAWINGS

In FIGS. 1 to 2*b*: 1—Carrier, 2—Chip, 3—Mark, 4—Substrate, and 5—Carrying board;

In FIGS. 3 to 10: 110—Blue tape pick-and-place section, 111—Chip holder, 112—First robotic arm, 113—Chip, 114—Mark, 120—Substrate pick-and-place section, 121—Substrate store, 122—Second robotic arm, 123—Substrate, 210—Chip pickup and separation section, 211—Separation platform, 212—Flip hand, 213—Pick-and-place apparatus, 214—Support, 215—Shifting unit, 216—Lifting unit, 217—Pick-and-place hand, 218—First alignment system, 219—Ejecting mechanism, 220—Chip alignment and fine-tuning section, 221—Second moving platform, 222—Fine tuning robotic arm, 223—Second alignment system, 230—Chip batch-bonding section, 231—Carrying platform, 232—Third alignment system, 300—Chip carrying board conveyor, 310—First moving platform, 320—Pressurizing apparatus, and 330—Carrying board.

DETAILED DESCRIPTION

To make the objects, advantages and features of the present invention more clear, the embodiments of the present invention will be described in greater detail below with reference to accompanying figures. It should be noted that the accompanying drawings are presented in a very simplified form and not necessarily presented to scale, with the only intention to facilitate convenience and clarity in explaining the object of the present invention.

Embodiment 1

Figure 1:
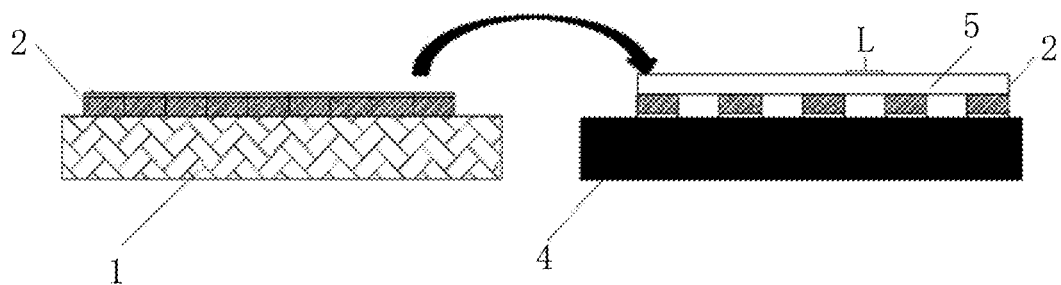
FIG. 1 is a schematic flowchart of a flip-chip batch bonding technique.
Figure 2A:
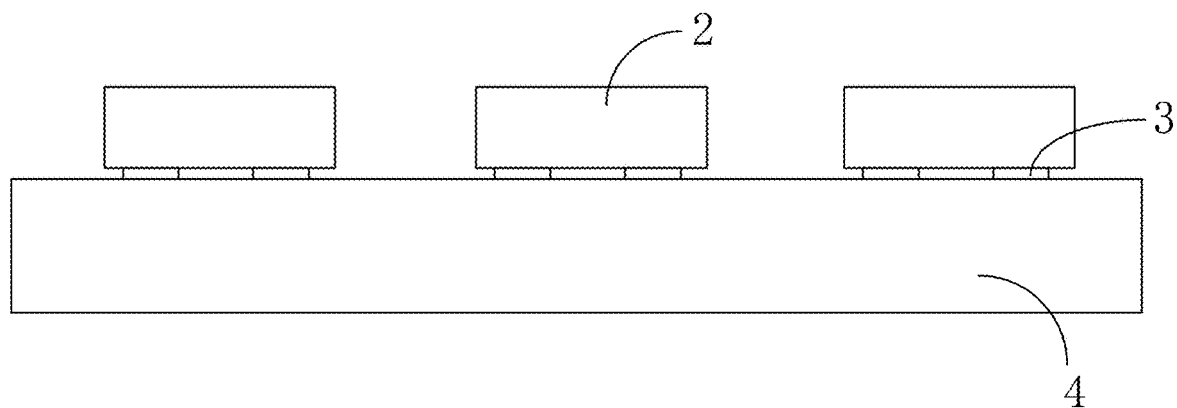
FIG. 2*a* and FIG. 2*b* are schematic diagrams of two chip mounting manners of the fan-out bonding technique, respectively.
Figure 2B:
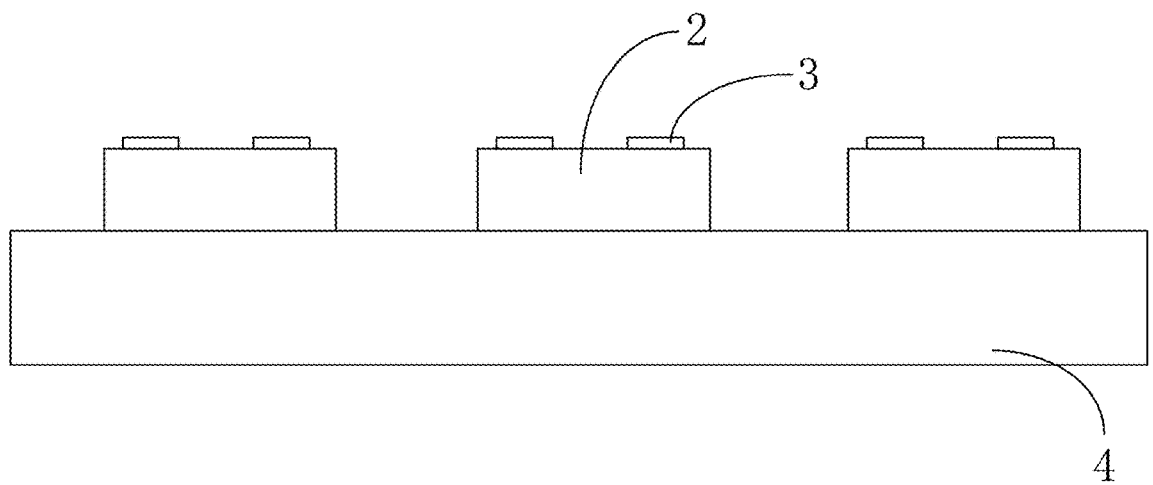
Figure 3:
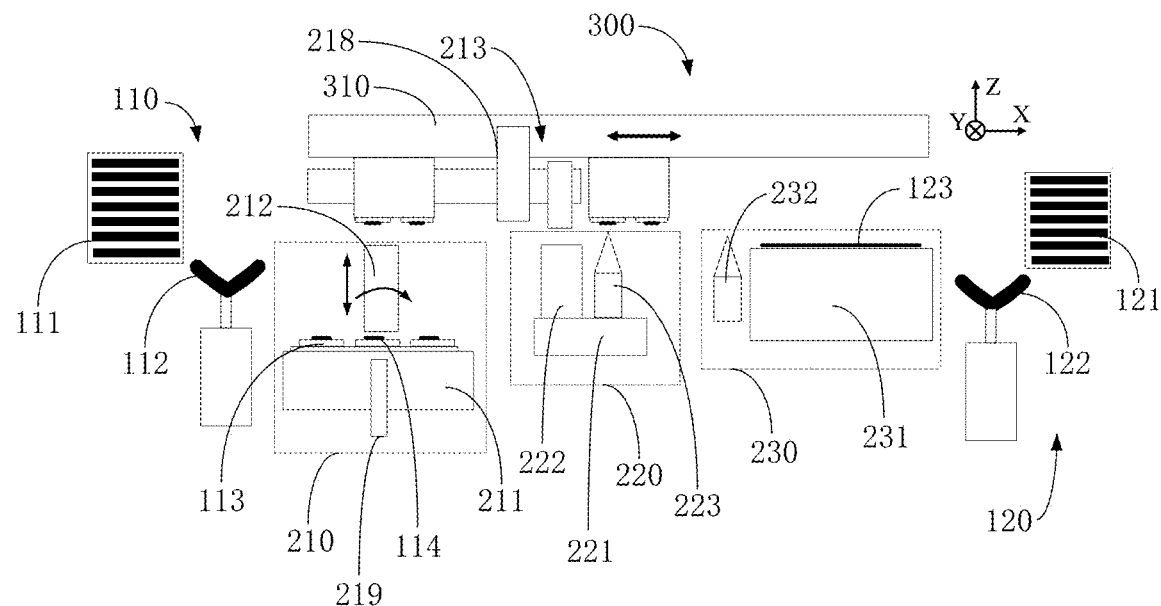
FIG. 3 is a front view of a universal chip batch-bonding apparatus according to Embodiment 1 of the present application.
Figure 4:
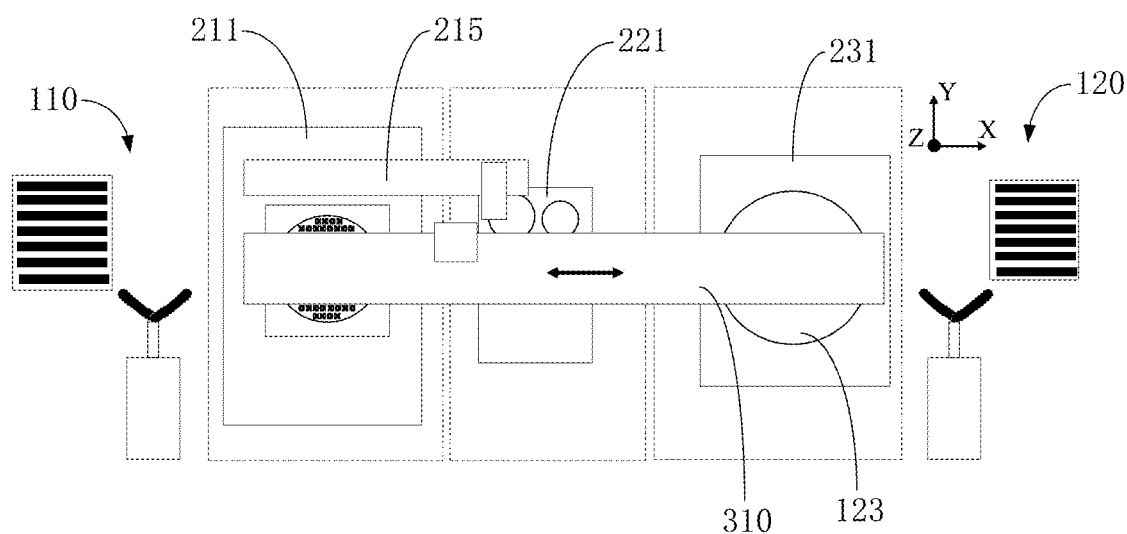
FIG. 4 is a top view of the universal chip batch-bonding apparatus according to Embodiment 1 of the present application.

As shown in FIG. 3 and FIG. 4, a universal chip batch-bonding apparatus provided in the present application includes a material pick-and-place area and a transfer work area.

The material pick-and-place area includes a blue tape pick-and-place section 110 for providing chips 113 and a substrate pick-and-place section 120 for storing a substrate 123. The blue tape pick-and-place section 110 and the substrate pick-and-place section 120 are disposed at opposing ends of the transfer work area, respectively. Chips 113 are loaded from the blue tape pick-and-place section 110, and are gathered to the substrate pick-and-place section 120 after completion of bonding.

The transfer work area sequentially includes a chip pickup and separation section 210, a chip alignment and fine-tuning section 220, and a chip batch-bonding section 230 along a direction from the blue tape pick-and-place section 110 to the substrate pick-and-place section 120.

A chip carrying board conveyor 300 is disposed in the transfer work area and arranged across the transfer work area. The chip carrying board conveyor moves between the chip pickup and separation section 210, the chip alignment and fine-tuning section 220, and the chip batch-bonding section 230 to deliver materials.

By means of the compatible design, the apparatus of the present application is universal for the two chip mounting manners of die-up and die-down, thereby expanding the application scope of the apparatus. In addition, the modular design is able to be configured as required, increasing the market potential of the apparatus. Moreover, by means of the chip batch-bonding manner, the bonding apparatus of the present application balances the time of chip pickup, adjustment of position accuracy of chip, and chip bonding, ensuring the bonding precision and also enhancing the productivity.

Figure 5:
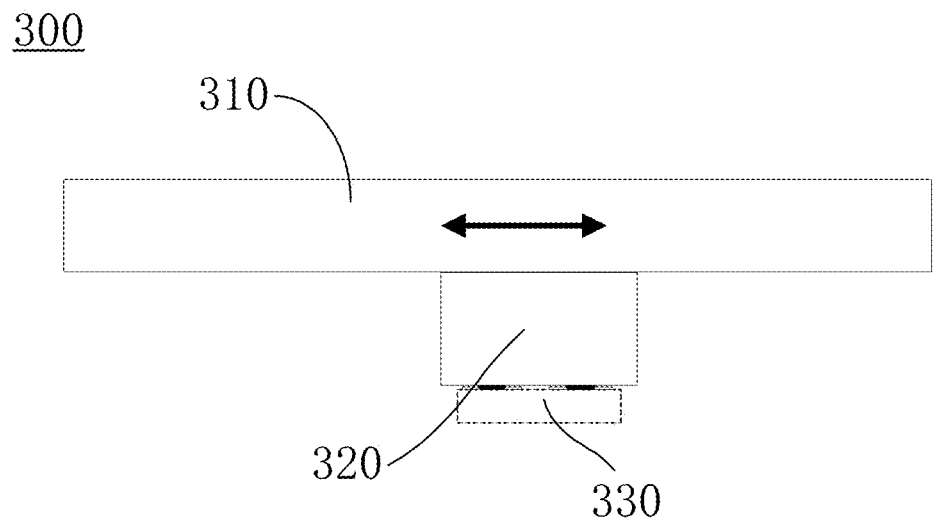
FIG. 5 is a schematic structural diagram of a chip carrying board conveyor according to Embodiment 1 of the present application.

Preferably, particularly referring to FIG. 5, the chip carrying board conveyor 300 includes a first moving platform 310, a pressurizing apparatus 320 mounted on the first moving platform 310, and a carrying board 330 mounted on the pressurizing apparatus 320. The carrying board 330 is configured to suck and hold a batch of chips 113 and to bond the batch of chips 113 to the substrate 123. The pressurizing apparatus 320 is configured to tightly bond the batch of chips 113 sucked by the carrying board 330 to the substrate 123.

Preferably, particularly referring to FIGS. 3 and 4, a separation platform 211, a flip hand 212, and a pick-and-place apparatus 213 are provided in the chip pickup and separation section 210; a fine tuning apparatus is provided in the chip alignment and fine-tuning section 220; and a carrying platform 231 is provided in the chip batch-bonding section 230. Specifically, a carrier configured to carry a group of chips 113 (for example, there are n chips 113 in total numbered from 1 to n) is provided on the separation platform 211. Definitely, each chip 113 is provided with a mark 114 on the upper side. The chips 113 are picked up and flipped by the flip hand 212 in the die-down mounting manner, and are picked up and placed by the pick-and-place apparatus 213 in the die-up mounting manner. After adjustment of position accuracy by the fine tuning unit, the chips 113 are conveyed to the chip batch-bonding section 230 by the chip carrying board conveyor 300, to be batch-bonded to the substrate 123 on the carrying platform 231.

Preferably, referring to FIG. 3 continuously, the ejecting mechanism 219 is provided under the separation platform 211 for pushing up the chip 113 placed on the separation platform 211 to facilitate the pickup by the flip hand 212 or the pick-and-place apparatus 213.

Figure 6:
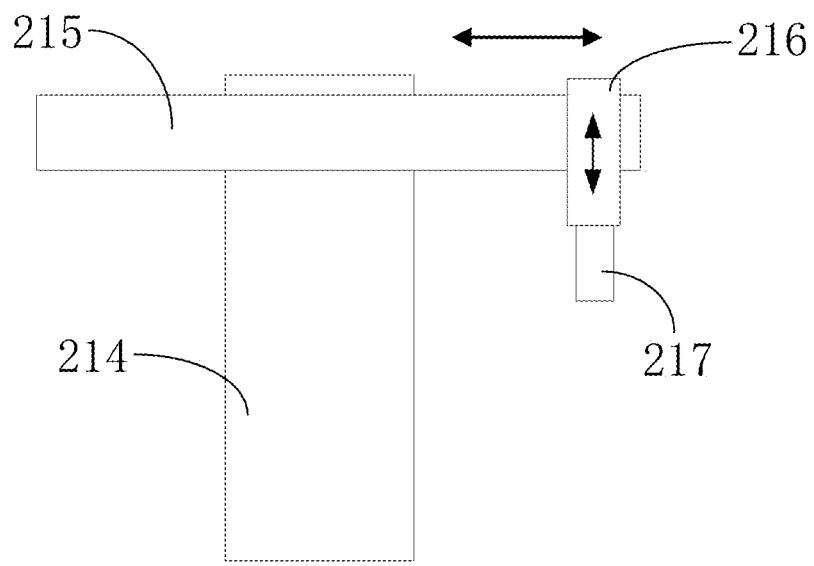
FIG. 6 is a schematic structural diagram of a pick-and-place apparatus according to Embodiment 1 of the present application.

Preferably, particularly referring to FIG. 6, the pick-and-place apparatus 213 includes a support 214, a shifting unit 215 mounted on the support 214 and movable in a horizontal direction, a lifting unit 216 mounted on the shifting unit 215 and movable in a vertical direction, and a pick-and-place hand 217 fixedly mounted on the lifting unit 216. The shifting unit 215 drives the lifting unit 216 to move horizontally (in an X direction), and the lifting unit 216 drives the pick-and-place hand 217 to move vertically (in a Z direction), such that the pick-and-place unit 213 is able to conveniently pick up the chips 113 from the separation platform 211 and accurately transfer the chips 113 to the fine tuning unit.

Preferably, referring to FIG. 3 continuously, the first alignment system 218 is further mounted on the support 214. The first alignment system 218 is used to scan the position of the chips 113 before the pick-and-place hand 217 picks up the chip 113 from the separation platform 211, ensuring accurate pickup of the chips 113 by the pick-and-place hand 217.

Preferably, referring to FIG. 3 continuously, the fine tuning apparatus includes a second moving platform 221, and a fine tuning robotic arm 222 and a second alignment system 223 which are mounted on the second moving platform 221. The second moving platform 221 drives the fine tuning robotic arm 222 and the second alignment system 223 to move horizontally (in the X direction), so that the second alignment system 223 successively scans positions of the plurality of the chips 113 on the carrying board 330. The fine tuning robotic arm 222 accurately places the plurality of the chips 113 onto the carrying board 330 according to the scanned position information and required position information.

Preferably, referring to FIG. 3 continuously, the third alignment system 232 is mounted on the carrying platform 231, and is configured to determine positions of marks on the substrate 123 and positions of marks on the chips 113, for bonding with the two marks completely aligned.

Preferably, referring to FIG. 3 and FIG. 4 continuously, a chip holder 111 and a first robotic arm 112 are provided in the blue tape pick-and-place section 110. The first robotic arm 112 picks up the chips 113 on the chip holder 111 and delivers the chips 113 to the separation platform 211. A substrate store 121 and a second robotic arm 122 are provided in the substrate pick-and-place section 120. The second robotic arm 122 picks up the bonding-completed substrate 123 on the carrying platform 231, and transfers the substrate to the substrate store 121.

Figure 7:
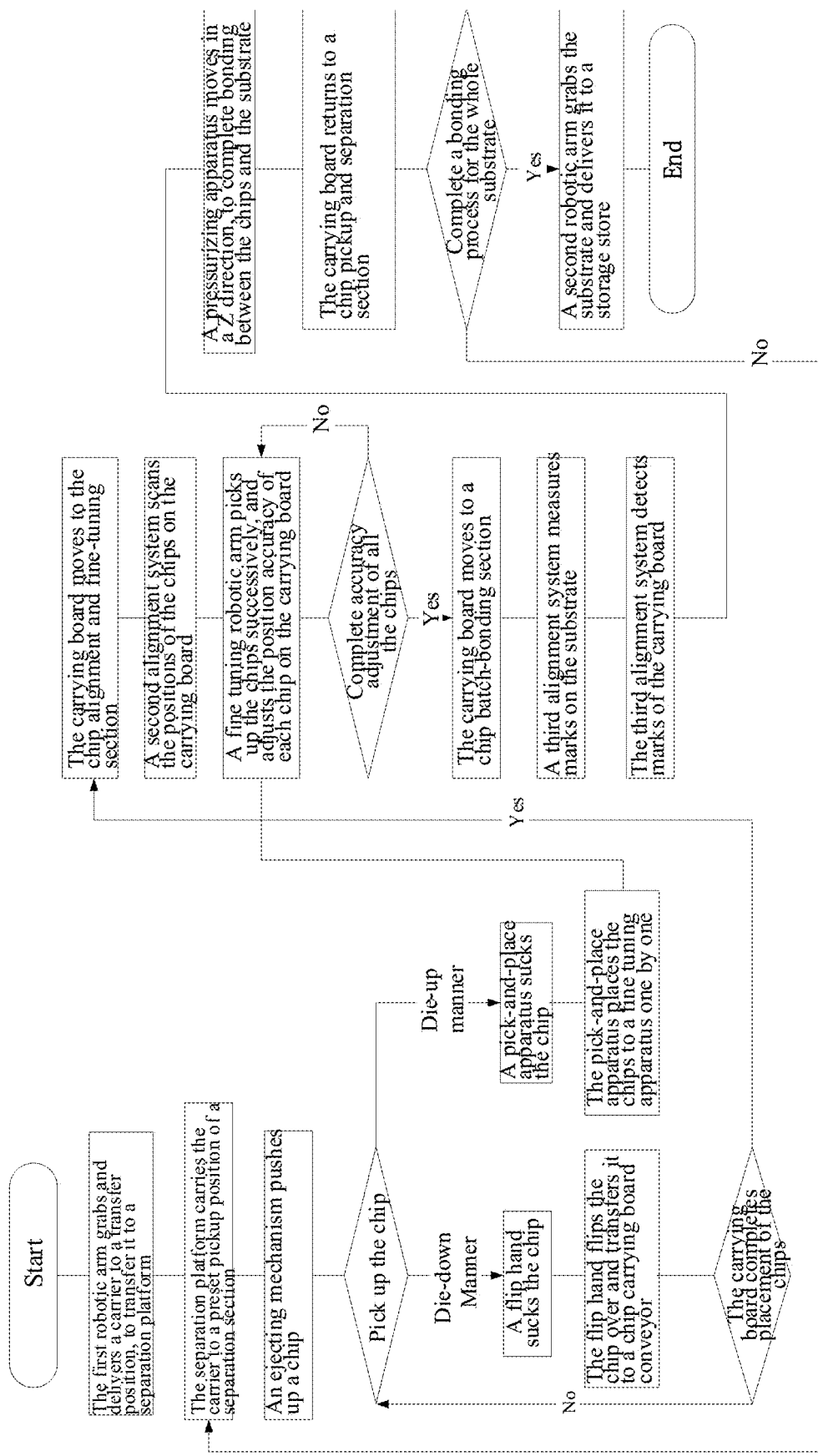
FIG. 7 is a schematic flowchart of a universal chip batch-bonding method according to Embodiment 1 of the present application.

Particularly referring to FIG. 7, the present application further provides a universal chip batch-bonding method, which is applied to the foregoing universal chip batch-bonding apparatus and includes the following steps:

S1: transferring the chips 113 from the blue tape pick-and-place section 110 to the chip pickup and separation section 210. Specifically, the first robotic arm 112 grabs the carrier on the chip holder 111 and places it on the separation platform 211.

S2: picking up a plurality of chips 113 from the chip pickup and separation section 210, and simultaneously delivering the plurality of the chips 113 to the chip alignment and fine-tuning section 220 by the chip carrying board conveyor 300, for adjustment of position accuracy.

S3: After adjustment is completed, delivering the plurality of the chips 113 to the chip batch-bonding section 230 by using the chip carrying board conveyor 300, to implement batch bonding.

By means of the chip batch-bonding manner, the bonding apparatus of the present application balances the time of chip pickup, adjustment of position accuracy of the chip, and chip bonding, ensuring the bonding precision and also enhancing the productivity.

Preferably, in step S2, if marks 114 of the chips 113 are required to face downwards during bonding, chips 113 are picked up and flipped by the flip hand 212 in the chip pickup and separation section 210, and then are transferred to the chip carrying board conveyor 300. After accuracy adjustment, the chips 113 are delivered to the carrying platform 231 for batch bonding. If the marks 114 of the chips 113 are required to face upwards during bonding, chips 113 are picked up by the pick-and-place apparatus 213 in the chip pickup and separation section 210 and then are transferred to the chip alignment and fine-tuning section 220. After accuracy adjustment, the chips 113 are transferred to the chip carrying board conveyor 300, and directly delivered to the carrying platform 231, for batch bonding. The present application is universal for the two mounting manners of die-up and die-down, expanding the application scope of the present application.

Embodiment 2

Figure 8:
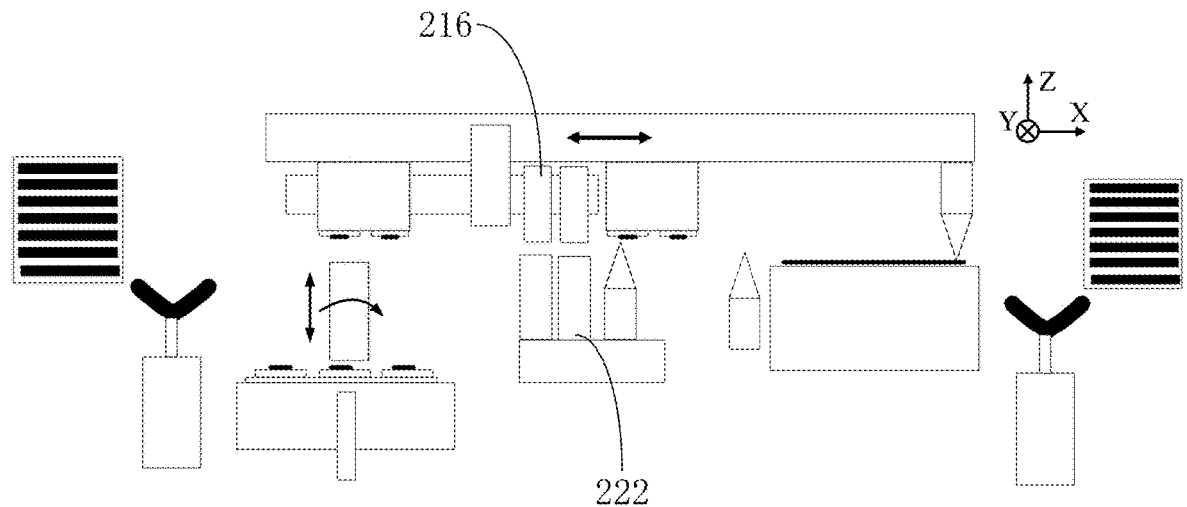
FIG. 8 is a front view of a universal chip batch-bonding apparatus according to Embodiment 2 of the present application.
Figure 9:
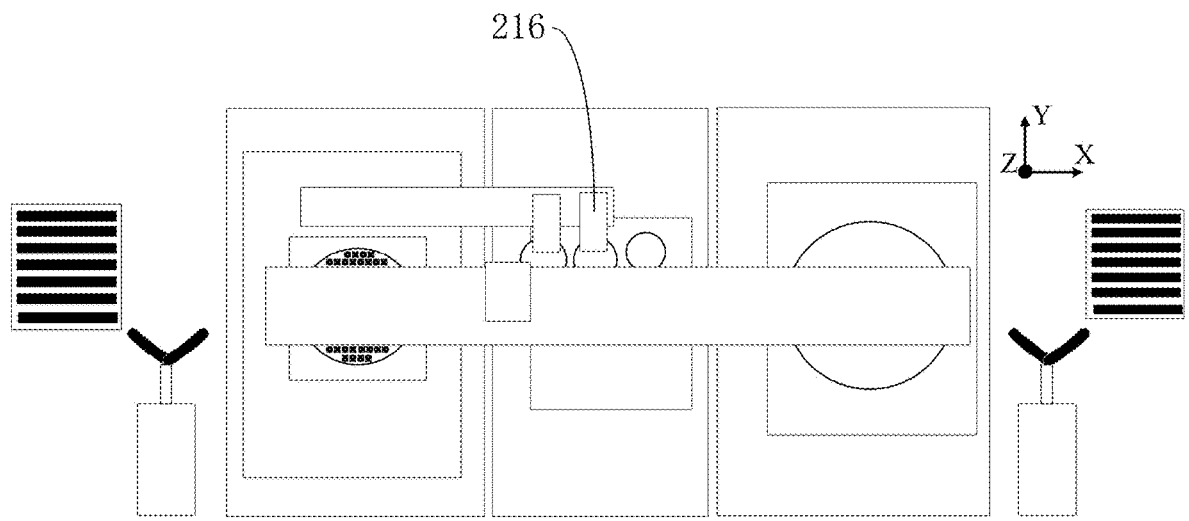
FIG. 9 is a top view of the universal chip batch-bonding apparatus according to Embodiment 2 of the present application.
Figure 10:
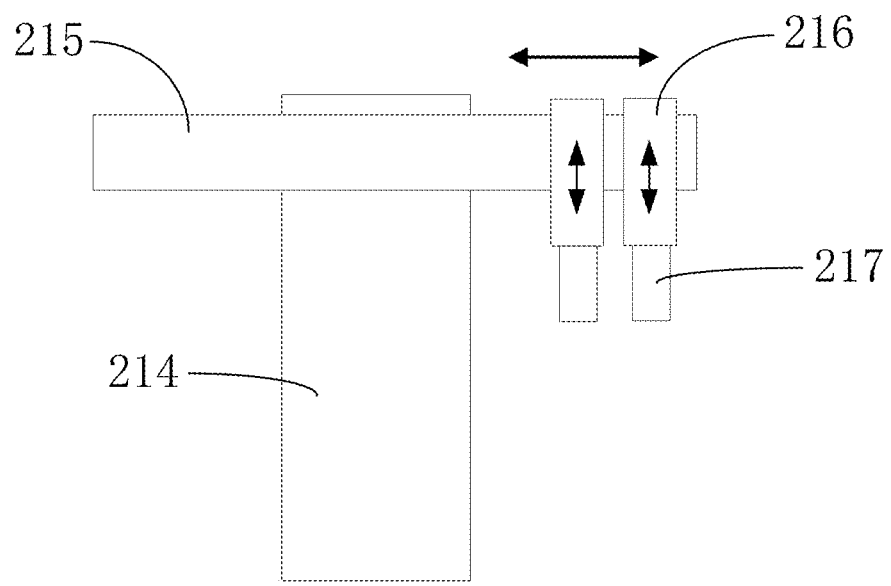
FIG. 10 is a schematic structural diagram of a pick-and-place apparatus according to Embodiment 2 of the present application.

Particularly referring to FIGS. 8 to 10, this embodiment differs from Embodiment 1 in that: a plurality of lifting units 216 is mounted on the shifting unit 215, and each lifting unit 216 has one pick-and-place hand 217 mounted therebeneath. That is to say, one movement of the shifting apparatus 215 along the support 214 is able to drive a plurality of the chips 113 to move simultaneously, improving working efficiency. Definitely, to coordinate with the simultaneous pick-and-place of the plurality of the pick-and-place hands 217, a plurality of the fine-tuning robotic arms 222 (as shown in FIG. 8) may be disposed in the chip alignment and fine-tuning section 220, further improving the working efficiency.

To sum up, in the universal chip batch-bonding apparatus and method provided in the present application, the apparatus includes a material pick-and-place area and a transfer work area, where the material pick-and-place area includes a blue tape pick-and-place section 110 for providing chips 113 and a substrate pick-and-place section 120 for storing a substrate 123, the blue tape pick-and-place section 110 and the substrate pick-and-place section 120 being disposed at opposing ends of the transfer work area, respectively; the transfer work area sequentially includes a chip pickup and separation section 210, a chip alignment and fine-tuning section 220, and a chip batch-bonding section 230 along a direction from the blue tape pick-and-place section 110 to the substrate pick-and-place section 120; a chip carrying board conveyor 300 is disposed in the transfer work area and arranged across the transfer work area, the chip carrying board conveyor moving between the chip pickup and separation section 210, the chip alignment and fine-tuning section 220, and the chip batch-bonding section 230 to deliver materials. By means of the compatible design, the apparatus of the present application is universal for two chip mounting manners, thereby expanding the application scope of the apparatus. In addition, the modular design is able to be configured as required, increasing the market potential of the apparatus.

It is apparent that those skilled in the art can make various modifications and variations of the present invention without departing from the spirit and scope thereof. Accordingly, the invention is intended to embrace all such modifications and variations if they fall within the scope of the appended claims and equivalents thereof.

What is claimed is:

1. A universal chip batch-bonding apparatus, comprising a material pick-and-place area and a transfer work area, wherein
    the material pick-and-place area comprises a blue tape pick-and-place section for providing chips and a substrate pick-and-place section for storing a substrate, the blue tape pick-and-place section and the substrate pick-and-place section being disposed at opposing ends of the transfer work area, respectively;
    the transfer work area sequentially comprises a chip pickup and separation section, a chip alignment and fine-tuning section, and a chip batch-bonding section along a direction from the blue tape pick-and-place section to the substrate pick-and-place section; and
    a chip carrying board conveyor is disposed in the transfer work area and arranged across the transfer work area, the chip carrying board conveyor moving between the chip pickup and separation section, the chip alignment and fine-tuning section, and the chip batch-bonding section to deliver materials,
    wherein the chip carrying board conveyor comprises a first moving platform, a pressurizing apparatus mounted on the first moving platform, and a carrying board mounted on the pressurizing apparatus.

2. The universal chip batch-bonding apparatus of claim 1, wherein a separation platform, a flip hand, and a pick-and-place apparatus are provided in the chip pickup and separation section; a fine tuning apparatus is provided in the chip alignment and fine-tuning section; and a carrying platform is provided in the chip batch-bonding section.

3. The universal chip batch-bonding apparatus of claim 2, wherein the pick-and-place apparatus comprises a support, a shifting unit mounted on the support and movable in a horizontal direction, a lifting unit mounted on the shifting unit and movable in a vertical direction, and a pick-and-place hand fixedly mounted on the lifting unit.

4. The universal chip batch-bonding apparatus of claim 3, wherein a first alignment system is mounted on the lifting unit.

5. The universal chip batch-bonding apparatus of claim 4, wherein the fine tuning apparatus comprises a second moving platform as well as a fine tuning robotic arm and a second alignment system mounted on the second moving platform.

6. The universal chip batch-bonding apparatus of claim 5, wherein a third alignment system is mounted on the carrying platform.

7. The universal chip batch-bonding apparatus of claim 3, wherein a plurality of lifting units are mounted on the shifting unit, and each lifting unit has one pick-and-place hand mounted therebeneath.

8. The universal chip batch-bonding apparatus of claim 2, wherein a chip holder and a first robotic arm are provided in the blue tape pick-and-place section, and the first robotic arm picks up chips on the chip holder and delivers the chips to the separation platform.

9. The universal chip batch-bonding apparatus of claim 2, wherein a substrate store and a second robotic arm are provided in the substrate pick-and-place section; and the second robotic arm picks up a bonding-completed substrate on the carrying platform, and transfers the substrate to the substrate store.

10. The universal chip batch-bonding apparatus of claim 2, wherein an ejecting mechanism is provided under the separation platform for pushing up the chip placed on the separation platform.

11. A universal chip batch-bonding method, used with the universal chip batch-bonding apparatus of claim 1, and comprising the following steps:
    S1: transferring chips from a blue tape pick-and-place section to a chip pickup and separation section;
    S2: picking up a plurality of the chips from the chip pickup and separation section, and simultaneously delivering the plurality of the chips to a chip alignment and fine-tuning section by a chip carrying board conveyor, for adjustment of position accuracy; and
    S3: after the adjustment is completed, delivering the plurality of the chips to a chip batch-bonding section by using the chip carrying board conveyor, to implement batch bonding.

12. The universal chip batch-bonding method of claim 11, wherein in step S2, if marks of the chips are required to face downwards during bonding, chips are picked up and flipped by a flip hand in the chip pickup and separation section and then are transferred to the chip carrying board conveyor; and if marks of the chips are required to face upwards during bonding, chips are picked up by a pick-and-place apparatus in the chip pickup and separation section and then are transferred to the chip carrying board conveyor after being subjected to accuracy adjustment in the chip alignment and fine-tuning section.

* * * * *